US005229628A

United States Patent [19]

Kobayashi et al.

[11] Patent Number: 5,229,628

[45] Date of Patent: Jul. 20, 1993

[54] ELECTROLUMINESCENT DEVICE HAVING SUB-INTERLAYERS FOR HIGH LUMINOUS EFFICIENCY WITH DEVICE LIFE

[75] Inventors: Shiro Kobayashi; Yuichi Aoki; Kouji Nakanishi, all of Tsukuba; Toshitaka Shigeoka, Suita; Tetsuro Yoshii, Tsukuba; Katsuhisa Enjoji, Tsuchiura; Etsuo Ogino, Tsukuba, all of Japan

[73] Assignee: Nippon Sheet Glass Co., Ltd., Osaka, Japan

[21] Appl. No.: 559,328

[22] Filed: Jul. 26, 1990

[30] Foreign Application Priority Data

| | | | |
|---|---|---|---|
| Aug. 2, 1989 | [JP] | Japan | 1-200929 |
| Sep. 4, 1989 | [JP] | Japan | 1-228944 |
| Feb. 22, 1990 | [JP] | Japan | 2-41960 |

[51] Int. Cl.[5] .......... H01L 33/00

[52] U.S. Cl. .......... 257/103; 257/78; 313/509

[58] Field of Search .......... 357/4, 16, 17, 30 L, 357/61, 63; 313/480, 468, 509, 498, 506, 503; 257/79, 103, 78

[56] References Cited

U.S. PATENT DOCUMENTS

| | | | |
|---|---|---|---|
| 3,919,589 | 11/1975 | Hanak | 313/506 |
| 3,975,661 | 8/1976 | Kanatani et al. | 357/4 |
| 4,266,223 | 5/1981 | Frame | 357/45 |
| 4,416,933 | 11/1983 | Antson et al. | 357/17 |
| 4,418,118 | 11/1983 | Lindors | 313/503 |
| 4,668,582 | 5/1987 | Matsuoka et al. | 313/509 |
| 4,672,264 | 6/1987 | Higton | 313/503 |
| 4,751,427 | 6/1988 | Barrow et al. | 313/509 |
| 4,758,765 | 7/1988 | Mitsumori | 313/506 |
| 4,849,673 | 7/1989 | Werring et al. | 313/498 |
| 4,967,251 | 10/1990 | Tanaka et al. | 357/6 |
| 5,074,817 | 12/1991 | Song | 313/509 |

FOREIGN PATENT DOCUMENTS

| | | | |
|---|---|---|---|
| 2-79391 | 3/1990 | Japan | 313/503 |
| 2176340A | 6/1985 | United Kingdom . | |
| 2176341A | 6/1985 | United Kingdom . | |

OTHER PUBLICATIONS

Lee et al., "Possible Degradation Mechanism in ZnS:Mn Alternating Current Thin Film Electroluminescent Display", Appl. Phys. Lett., vol. 58, No. 9, Mar. 4, 1991.

SID 84 Digest entitled "High-Contract Thin-Film/-Powder Composite DCEL Devices" by Malcolm H. Higton, 1984.

*Primary Examiner*—Rolf Hille
*Assistant Examiner*—Minhloan Tran
*Attorney, Agent, or Firm*—Woodcock Washburn Kurtz Mackiewicz & Norris

[57] ABSTRACT

An electroluminescence device is constituted by sequentially stacking a glass substrate, a transparent electrode, a luminescent layer, an interlayer containing a semiconductor having a band gap of 2.4 eV or more, a current-limiting layer containing a conductive powder, and a backplate.

27 Claims, 3 Drawing Sheets

ELECTROLUMINESCENT DEVICE HAVING SUB-INTERLAYERS FOR HIGH LUMINOUS EFFICIENCY WITH DEVICE LIFE

BACKGROUND OF THE INVENTION

1. Field of the Invention

The present invention relates to an electroluminescence (to be referred to as an EL hereinafter) device which can be used to display characters or graphic patterns and, more particularly, to a thin film-powder hybrid type EL device.

2. Description of the Prior Art

An EL display using an EL device can display characters or graphic patterns with high display quality and therefore is one of flat displays which have been rapidly, widely spread as a terminal of a portable type computer or a terminal of a work station in recent years.

The EL devices are classified into an AC thin film type EL device having a structure in which a thin-film luminescent layer and insulating layers arranged at two sides of the luminescent layer are sandwiched by electrodes, and a DC powder type EL device having a structure in which a luminescent layer consisting of a zinc sulfide powder and a current-limiting layer consisting of a Cu-coated zinc sulfide powder are sandwiched by electrodes. These two types are already put into practical use. In recent years, however, in addition to the above two types of EL devices, a thin film-powder hybrid type EL device (to be referred to as a hybrid type EL device herinafter) having a combination of a thin-film luminescent layer and a current-limiting layer using a powder is proposed as a high-cost performance EL device which can realize high display quality with low cost (e.g., GB2176340 and GB2176341).

FIG. 4 is a sectional view showing a basic arrangement of the hybrid type EL device. A basic structure, a manufacturing method, and an operation mechanism of the hybrid type EL device will be described below with reference to FIG. 4.

A film of a transparent electrode material such as ITO is formed as a transparent electrode 2 on a glass substrate 1 by sputtering or a vacuum vapor deposition method and patterned into a predetermined shape by using, e.g., photolithography. A luminescent layer 3 is formed on the transparent electrode 2 by a vacuum vapor deposition method, a sputtering method, an MOCVD method or the like. A material which is often used as the material of the luminescent layer 3 is obtained by doping, as a luminescent center, a transition metal such as Mn and Cu, a rare-earth metal such as Tb, Sm, Dy, Eu and Ce or a fluoride or chloride thereof into a Group II-VI compound or Group IIa-VIb compound such as ZnS, ZnSe, CaS and SrS. Subsequently, a current-limiting layer 4 is formed on the luminescent layer 3. The current-limiting layer 4 serves as a resistor for preventing an excessive current from flowing through the luminescent layer 3. The current-limiting layer 4 normally consists of a film formed by using a conductive fine powder having a resistivity of $3\times10^3$ Ω·cm to $1\times10^6$ Ω·cm and a binder resin by a spray method and having a film thickness of 1 to 30 μm, and preferably, 5 to 30 μm. Examples of the conductive fine powder are Cu-coated ZnS, $MnO_2$, PbS, CuO, PbO, $Tb_4O_7$, $Eu_2O_3$, $PrO_2$, carbon and barium titanate. These compounds are used singly or in the form of mixtures. In order to increase contrast, a black or dark substance is preferably used (however, the substance need not be black or dark). A film consisting of Al or the like is formed as a backplate 5 to have a film thickness of about 1 μm on the current-limiting layer 4 by using a vacuum vapor deposition method or the like. The backplate 5 is mechanically scribed by using a diamond needle, thereby completing a dot-matrix type or segment type hybrid EL device.

Driving is normally performed by applying a DC pulse voltage from a driving power source 9 by using the transparent electrode 2 as an anode and the backplate 5 as a cathode. Alternatively, the device can be driven by an AC voltage. In a dot-matrix type device capable of displaying characters or graphic patterns, a time-division driving method of sequentially scanning lines along the row direction is used. Electrons are injected from an interface between the current-limiting layer and the luminescent layer into the luminescent layer. These electrons are accelerated by a high electric field in the luminescent layer and are bombarded against luminescent centers in a high-energy state. Then, the excited luminescent centers emit light when they are relaxed.

A hybrid type EL device having a structure similar to the above basic hybrid type EL structure is known. For example, a hybrid type EL device in which a dark thin film layer is inserted between the luminescent layer 3 and the current-limiting layer 4 shown in FIG. 4 is reported (e.g., U.S. Pat. No. 4,672,264 and GB2176341A). Since the dark thin film layer is inserted, light emitted from the luminescent layer toward a backplate is absorbed by this thin film layer. As a result, since the light is prevented from being irregularly reflected by the current-limiting layer, the contrast of display can be increased. Especially when a material which is not dark such as a Cu-coated zinc sulfide powder is used as the current-limiting layer, a significant effect can be obtained in an improvement in contrast by inserting a dark thin film layer. Examples of the material of the dark thin film layer are ZnTe (dark brown), CdTe (black), CdSe (black/brown), chalcogenide glass (black), $Sb_2S_3$ (black/brown), and other arbitrary dark materials such as oxides and sulfides of transition metals and rare-earth metals, e.g., PbS, PbO, CuO, $MnO_2$, $Tb_4O_7$, $Eu_2O_3$, $PrO_2$ and $Ce_2S_3$. The film thickness of the thin film layer is normally 2 μm or less.

In the hybrid EL device having the conventional basic structure as shown in FIG. 4, when Mn-doped zinc sulfide is used for the luminescent layer, a ratio (luminous efficiency) of luminescent energy of the device to energy applied to the device is 0.02% W/W to 0.05% W/W.

In the conventional hybrid EL device in which the dark thin film layer is inserted between the luminescent layer and the current-limiting layer as described above, a luminous efficiency of the device is decreased to be smaller than that of the device having no dark thin film layer.

When the above hybrid type EL devices are used as a dot-matrix type display for displaying characters or graphic patterns, even if a luminous efficiency of the device is 0.05% W/W which is the highest luminous efficiency obtained by the above conventional devices, this luminous efficiency is still unsatisfactory.

If the above hybrid EL devices are used as a display having a small or middle capacity of about 640 ×200 dots, a luminance of 50 $cd/m^2$ which is a practical luminance of a display can be obtained by the luminous efficiency described above. If, however, the above devices are used as a display having a middle or large capacity of about 640×400 dots or 1,024×800 dots, which is currently mainly used, a voltage application time per device, i.e., a so-called duty ratio is decreased. As a result, a luminance is decreased to about 20 $cd/m^2$ to 40 $cd/m^2$ which are practically unsatisfactory.

Consumption power of a display is in inverse proportion to a luminous efficiency. When the above hybrid EL devices are used as a display having a small or middle capacity of about 640×200 dots with an A5-size panel area, the consumption power of the hybrid EL devices is about 25 W during entire surface light emission while it is about 10 W in the same panel when, e.g., AC thin film EL devices are used. That is, the consumption power of the hybrid EL device is very high.

Since the consumption power of the device is very high, power to be applied to the device is increased to shorten the life of the device.

In the hybrid EL device as shown in FIG. 4, the current-limiting layer 4 prevents the resistivity of the luminescent layer 3 from being decreased to flow an excessive current through the EL device, thereby preventing thermal destruction of the device.

As the resistance of the current-limiting layer 4 is increased, stability of the device with respect to destruction is improved. If, however, the resistance is too high, a voltage drop in the current-limiting layer 4 is increased to increase a drive voltage of the EL device. Therefore, the value of the resistance is limited. When the film thickness of the current-limiting layer 4 is 5 μm to 30 μm, the current-limiting layer 4 preferably has a resistance of 10 to 2,000 Ω per unit area (1 $cm^2$) in a direction of film thickness, i.e., has a resistivity of about $1\times10^4$ Ω·cm to $2\times10^6$ Ω·cm.

Since the material of the conductive fine powder described above must have the above resistivity after it is fixed by a binder, it desirably has a resistivity of about $1\times10^4$ Ω·cm to $2\times10^6$ Ω·cm.

In an initial stage of development of the above hybrid type EL device, a Cu-coated ZnS powder which is conventionally used in a powder type EL device is often used as the material of the conductive fine powder. Recently, however, an $MnO_2$ powder is used which increases display contrast because it is black and does not change its resistance over time due to no movement of Cu.

These powders are prepared by mechanically pulverizing or milling coarse powders or tabular materials having a comparatively large particle size produced by a precipitation or electrolytic process.

In the above conventional hybrid type EL device, however, a luminance variation is produced during an operation or a life of the device is shortened.

In addition, in the above conventional hybrid type EL device, a luminous efficiency is as low as at most about 0.1 lm/W. Therefore, this conventional hybrid type EL device cannot provide brightness suitable for a practical use.

OBJECT AND SUMMARY OF THE INVENTION

It is an object of the present invention to provide an electroluminescence device which has a high luminous efficiency and a high luminance, largely reduces consumption power, and has a long life.

In order to achieve the above object, there is provided an electroluminescence device in which a first electrode having transparency, a luminescent layer, a current-limiting layer and a second electrode are sequentially stacked on a substrate having transparency and an electrical insulating property, wherein an interlayer containing a first semiconductor having a band gap of 2.4 eV or more is formed in contact with the luminescent layer.

According to another aspect of the present invention, there is provided an electroluminescence device in which a first electrode having transparency, a luminescent layer, a current-limiting layer consisting of a binder and a conductive powder mainly containing carbon black, and a second electrode are sequentially stacked on a substrate having transparency and an electrical insulating property.

According to still another aspect of the present invention, there is provided an electroluminescence device in which a first electrode having transparency, a luminescent layer, a current-limiting layer consisting of a conductive powder and a binder, and a second electrode are sequentially stacked on a substrate having transparency and an electrical insulating property, wherein the conductive powder contained in the current-limiting layer is electrically in point contact with the surface of the luminescent layer.

BRIEF DESCRIPTION OF THE DRAWINGS

The foregoing and other objectives, features and advantages of the invention will be more readily understood upon consideration of the following detailed description of certain preferred embodiments of the invention, taken in conjunction with the accompanying drawings, in which.

DETAILED DESCRIPTION OF THE PREFERRED EMBODIMENTS

Embodiments of the present invention will be described below with reference to FIGS. 1 to 5.

Figure 1:
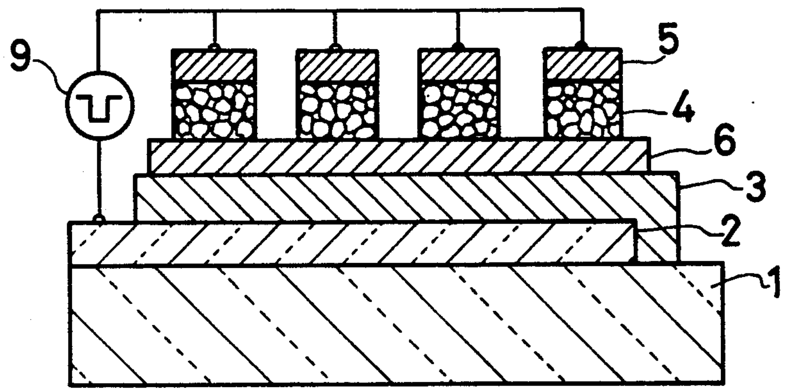
FIG. 1 is a sectional view showing an electroluminescence device of the first embodiment according to the present invention.

As shown in FIG. 1, the first embodiment is constituted by sequentially stacking a transparent electrode 2, a luminescent layer 3, an interlayer 6 containing a semiconductor having a band gap of 2.4 eV or more, a current-limiting layer 4 and a backplate 5 on a transparent glass substrate 1.

The semiconductor having a band gap of 2.4 eV or more contained in the interlayer 6 inserted between the luminescent layer 3 and the current-limiting layer 4 includes a compound semiconductor. Examples of the compound semiconductor consisting of two elements are CuBr (2.9 eV) and γAgI (2.8 eV) of Group I-VII; CaS (5.4 eV), CaSe (5.0 eV), CaTe (4.3 eV), MgSe (5.6 eV), MgTe (4.7 eV), ZnO (3.2 eV), ZnS (3.7 eV), ZnSe (2.6 eV), SrO (5.8 eV), SrS (4.8 eV), SrSe (4.6 eV), SrTe (4.0 eV), CdS (2.4 eV), BaO (4.2 eV), BaS (4.0 eV), BaSe (3.7 eV) and BaTe (3.4 eV) of Group II-VI; $HgI_2$ (2.5 eV) of Group II-VII; AlAs (2.4 eV), GaN (3.4 eV) and AlP (3.0 eV) of Group III-V; $Al_2O_3$ (>5 eV), $Al_2S_3$ (4.1 eV), $Al_2Se_3$ (3.1 eV), $Al_2Te_3$ (2.5 eV, $Ga_2O_3$ (4.4 eV), GaS (2.5 eV) and $In_2O_3$ (3.5 eV) of Group III-VI; SiC (2.9 eV) of Group IV—IV; $TiO_2$ (3.0 eV) and $SnO_2$ (4.3 eV) of Group IV-VI; and $As_2O_3$ (4.0 eV), $As_2S_3$ (2.5 eV), $Sb_2O_3$ (4.2 eV) and $Bi_2O_3$(3.2 eV) of Group V-VI. Examples of the compound semiconductor consisting of three elements are $PbCO_3$ (4.4 eV), $H_3BO_3$ (5.1 eV) and $ZnIn_3Se$ (2.6 eV). Note that numerals in parentheses represent a (self) band gap of each substance in bulk.

In addition to compound semiconductors, organic semiconductors and amorphous semiconductors having a band gap of 2.4 eV or more can be used.

Also, oxides and nitrides such as $BaTiO_x$, $TaO_x$, $SiN_x$, SiON and SiAlON which are originally insulators but have semiconducting properties because they are offset from stoichiometry can be used. In addition to the above substances, any substance having a band gap of 2.4 eV and semiconducting properties can be used.

These substances may contain various impurities such as Ag, Cu, Ni, W, P, Sb, Li, Cl and B as long as they have a band gap of 2.4 eV or more.

The above substances can be used singly, in the form of mixed crystals such as ZnSSe and CaSTe, or in the form of mixtures such as a combination of ZnS and MgTe.

The interlayer 6 may be a thin film or a film consisting of a fine powder. The arrangement of the interlayer 6 may be a single-layered film of the compound semiconductor described above or a multilayered film of these films.

Alternatively, the arrangement of the interlayer 6 may be a multilayered structure or a mixed structure of the films with another substance, e.g., a nitride such as $Si_3N_4$ and AlN, an oxynitride such as SiON and SiAlON, an oxide such as $Ta_2O_3$ and $TiO_2$, a carbide such as SiC and Wsi and a silicide.

In order to increase a luminous efficiency, the semiconductor is preferably at least one semiconductor selected from the group consisting of ZnS, ZnSe, CaS, CaSe, SrS, SrSe and CdS.

Although the luminescent layer 3 is generally doped with an element serving as a luminescent center, the interlayer 6 in this embodiment may consist of a semiconductor doped with an element serving as the luminescent center.

When the interlayer 6 consists of a semiconductor doped with an element serving as the luminescent center, the luminescent layer 3 and the interlayer 6 are essentially distinguished from each other as substances containing different types of semiconductors or substances containing semiconductors of the same type but having different band gaps.

The thickness of the interlayer 6 to be inserted is preferably 10 nm to 300 nm. If the thickness is smaller than 10 nm, it is difficult to form a continuous film, and a luminance variation is easily caused. If the thickness is larger than 300 nm, not only a luminous efficiency is decreased, but also a driving voltage is increased to increase the cost of a driver IC or to cause breakdown. The thickness is optimally 50 nm to 150 nm though it depends on film formation conditions.

Although an insertion position of the interlayer 6 is preferably between the luminescent layer 3 and the current-limiting layer 4, it may be between the luminescent layer 3 and the transparent electrode 2. Alternatively, the luminescent layer 3 may be divided to insert the interlayer 6 between the divided layers.

Since the material such as ZnS, CaS or SrS for use in the luminescent layer 3 normally has a band gap of 3 to 5 eV and is of n-type, an energy difference between a conduction band and a Fermi level is about 1.0 to 1.5 eV. The number of electrons excited on the conduction band is almost zero at room temperature, and therefore the luminescent layer 3 is an insulator. When a high electric field of about 1 MV/cm or more is applied to the luminescent layer 3, however, electrons become thermions, and the conductivity of the luminescent layer 3 is largely increased. Luminescence of the EL device occurs in this state.

The current-limiting layer 4 consists of a semiconductor having a resistivity of $3\times10^3\ \Omega\cdot cm$ to $1\times10^6\ \Omega\cdot cm$ close to that of a conductor at room temperature. Therefore, an energy difference between a conduction band and Fermi level is much smaller than that of the luminescent layer 3. The energy difference actually calculated from a temperature coefficient of a resistance is 0.2 eV or less. Therefore, electrons are present on the conduction band even at room temperature.

The luminescent layer 3 and the current-limiting layers 4 having the above electrical properties are formed in contact with each other, and a voltage is applied from the driving power source 9 shown in FIG. 1 by using the current-limiting layer 4 as a cathode and the luminescent layer 3 as an anode, thereby obtaining luminescence of the EL device. For this purpose, an electric field having a certain value or more is applied.

The value of the electric field is naturally larger than a value (A) of an electric field required to set the luminescent layer in a thermionic conduction state. In addition, the value must be larger than an electric field value (B) which allows electrons to go over an energy barrier (like a Schottky barrier) present between the current-limiting layer 4 and the luminescent layer 3. The latter value (B) is substantially the same as but slightly smaller than the former value (A). Therefore, the electric field value (A) required to set the luminescent layer 3 in a thermionic conduction state is normally an electric field value in the luminescent layer 3 during light emission.

When the interlayer 6 is inserted between the current-limiting layer 4 and the luminescent layer 3, however, a heterojunction is formed between the interlayer 6 and the luminescent layer 3. If the interlayer 6 consists of an n-type semiconductor, an energy barrier such as a notch or a spike is formed on the surface of the heterojunction regardless of whether the luminescent layer 3 is of n- or p-type. Therefore, the intensity of the energy barrier obtained when electrons are injected from the current-limiting layer 4 into the luminescent layer 3 becomes much larger than that obtained when no interlayer 6 is formed. For this reason, the electric field value (B) required to allow electrons to go over the energy barrier present between the current-limiting layer 4 and the luminescent layer 3 becomes larger than the electric field value (A) required to set the luminescent layer 3 in a thermionic conduction state. As a result, the intensity of the electric field in the luminescent layer 3 during light emission becomes larger than that obtained when no interlayer 6 is formed.

If the interlayer 6 consists of a p-type semiconductor and the luminescent layer 3 is of p-type, an energy barrier called a notch is formed on the surface of the heterojunction as described above. The intensity of the electric field in the luminescent layer 3 during light emission becomes larger than that obtained when no interlayer 6 is formed. If the interlayer 6 consists of a p-type semiconductor and the luminescent layer 3 is of n-type, no energy barrier is formed on the surface of the heterojunction. However, an energy difference between a conduction band and a Fermi level of the p-type semiconductor having a band gap of 2.4 eV or more is 2 eV or less which is a value larger than an energy difference of 1.0 to 1.5 eV between a conduction band and a Fermi level of the n-type luminescent layer 3. Therefore, the interlayer 6 itself serves as an energy barrier (C) against electrons. Also in this case, therefore, the electric field value (D) required to allow electrons to go over the energy barrier (C) becomes larger than the electric field value (A) required to set the luminescent layer 3 in a thermionic conduction state. As a result, the intensity of the electric field in the luminescent layer 3 during light emission becomes larger than that obtained when no interlayer 6 is formed.

In any case, by inserting a semiconductor having a band gap of 2.4 eV or more as the interlayer 6 between the current-limiting layer 4 and the luminescent layer 3, the intensity of the electric field in the luminescent layer 3 during light emission can be increased to increase a luminous efficiency.

In a structure in which the luminescent layer 3 is divided into two or more layers and the interlayer 6 is formed between the divided layers, the intensity of an electric field in at least one luminescent layer is increased for the same reason as described above, and a luminous efficiency is increased as a whole.

When the interlayer 6 is inserted between the luminescent layer 3 and the transparent electrode 2, since electrons flow in an opposite direction, the above description cannot be directly applied. For basically the same reason as described above, however, an energy barrier is formed regardless of whether the semiconductor is of n- or p-type, and the electric field intensity of the luminescent layer 3 is increased to increase the luminous efficiency.

If a semiconductor having a band gap smaller than 2.4 eV is used as the interlayer 6, an energy difference between a conduction band and a Fermi level of the interlayer 6 becomes smaller than that of the luminescent layer 3. Therefore, even if a new energy barrier such as a notch or a spike is formed on the surface of the heterojunction, the intensity of the energy barrier is decreased as a whole, and the electric field intensity in the luminescent layer 3 is not increased. For this reason, the luminous efficiency cannot be increased.

Figure 4:
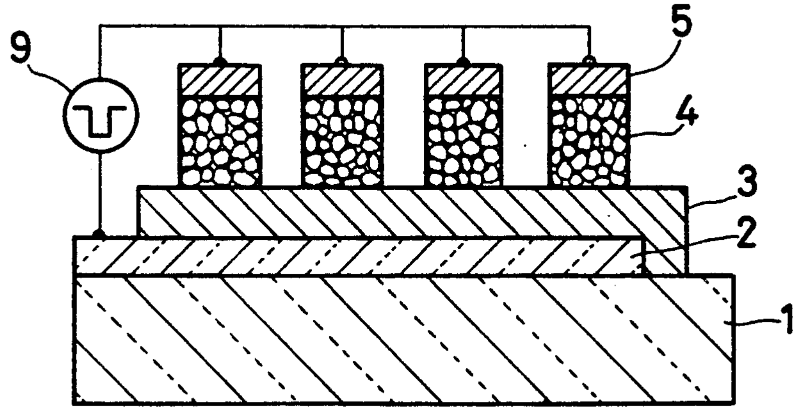
FIG. 4 is a sectional view showing electroluminescence devices of the third and fourth embodiments and a conventional electroluminescence device.

In the conventional hybrid type EL device as shown in FIG. 4, if Mn-doped zinc sulfide is used for as the luminescent layer, its luminous efficiency is 0.02% W/W to 0.05% W/W (e.g., GB2176340A or Digest (1984, p. 30) of Society of Information Display (to be referred to as SID hereinafter)).

As shown in Table 2 at the upper right corner of page 31 of the above SID Digest (1984), in a conventional hybrid type EL device in which a dark thin film layer is inserted between a luminescent layer and a current-limiting layer, a luminous efficiency is 0.01% W/W to 0.02W/W even if the device uses chalcogenide glass which provides the highest luminance in luminance characteristics of devices in each of which ZnTe, CdTe, CdSe, chalcogenide (black) or $Sb_2S_3$ is inserted between a luminescent layer (ZnS:Mn) and a current-limiting layer ($MnO_2$). This luminous efficiency is a half or less than that obtained when no dark thin film layer is formed. The fact that a luminous efficiency is decreased when a dark thin film layer is inserted is also described in GB2176341A.

In this embodiment, the interlayer 6 consisting of a semiconductor having a band gap of 2.4 eV or more is inserted between the luminescent layer 3 and the current-limiting layer 4. A luminous efficiency is significantly increased by inserting the interlayer 6 for the following reason. That is, the height of an electron barrier formed when electrons are injected from the current-limiting layer 4 into the luminescent layer 3 is increased by the inserted interlayer 6, and the electric field intensity in the luminescent layer 3 is increased accordingly. As a result, an energy supplied from the electric field to the electrons is increased.

The reason why a luminous efficiency is not increased by a thin film layer formed between a luminescent layer and a current-limiting layer in the conventional structure is not clear. However, all of conventionally used thin film layers consist of substances having dark colors, and such a black substance has a band gap smaller than 2.4 eV since a band gap of 2.4 eV corresponds to an absorption end of 517 nm. Actually, band gaps of the conventionally used substances are 2.1 eV, 1.5 eV and 1.7 eV for ZnTe, CdTe and CdSe, respectively.

To further illustrate this invention, and not by way of limitation, the following example is given, which has the same structure as described in said first embodiment.

EXAMPLE 1

An electroluminescence device having the structure shown in FIG. 1 was manufactured as follows.

That is, an ITO film as a transparent electrode 2 was formed to have a thickness of about 500 nm on a transparent glass substrate 1 (corning 7059) by a reactive sputtering method, and this transparent electrode 2 was patterned into stripes at a pitch of five stripes per 1 mm of photolithography. This patterning is performed in, e.g., the X direction on an X-Y plane. Subsequently, film formation was performed at a substrate temperature of 200° C. and a deposition rate of 80 nm/min. by using a two-source electron beam vapor deposition method in which ZnS and Mn were independently controlled, thereby forming a ZnS film containing 0.5 wt % of Mn and having a thickness of 1 μm as a luminescent layer 3. Thereafter, the resultant structure was annealed in vacuum at a temperature of 550° C. for about two hours.

Pellets of ZnSe (band gap=2.6 eV) having a purity of 99.999% were used as a deposition source to form a 90-nm thick ZnSe film as an interlayer 6 at a substrate temperature of 250° C. by an electron beam vapor deposition method.

Subsequently, a paint prepared by dispersing an $MnO_2$ powder in a solution mixture of a resin and thinner was coated by a spraying method and dried to form a current-limiting layer 4 having a resistivity of $1\times10^5$ Ω·cm and a film thickness of 12 μm.

Al was used to form a 1-μm thick film as a backplate 5 by an electron beam vapor deposition method. The current-limiting layer 4 and the backplate 5 were patterned into stripes in, e.g., the Y direction on the X-Y plane by using a diamond needle. The entire device was covered with cover glass as a countermeasure against humidity, thereby completing the manufacture of an EL device having a dot-matrix structure.

Figure 2:
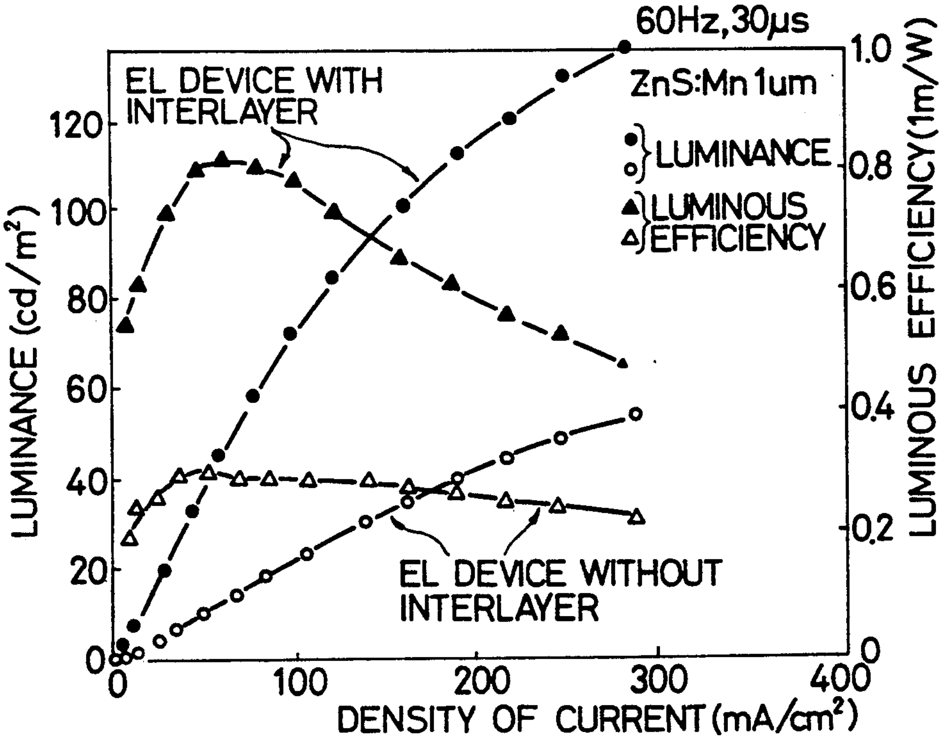
FIG. 2 is a graph showing a relationship between a density of a current to be flowed into the electroluminescence device shown in FIG. 1 and conventional electroluminescence devices having no interlayers and a luminance and a luminous efficiency obtained by the devices.

FIG. 2 shows current density vs. luminance/luminous efficiency characteristics of the EL device manufactured as described above. As shown in FIG. 2, the luminous efficiency of the EL device having the interlayer 6 is increased to be twice or more that of an EL device not having an interlayer.

When the conventional hybrid type EL device was driven under the conditions of 60 Hz, 30 μs and 100 $mA/cm^2$ (corresponding to driving conditions for 640×400 dots), the luminance of only about 20 to 30 $cd/cm^2$ could be obtained. In the EL device of Example 1 in which the interlayer 6 was inserted, however, a practically satisfactory luminance of 70 $cd/cm^2$ or more could be obtained under the same driving conditions. A 640×400 dot-matrix display was manufactured by using the EL devices of this example. As a result, a luminous efficiency at a current value required to obtain a luminance of 50 $cd/cm^2$ was increased from 0.05% W/W of a conventional device to 0.16% W/W, i.e., increased three times or more by insertion of the interlayer 6. For this reason, consumption power was largely reduced from 25 W of the conventional device to 8W, i.e., reduced to about ⅓. In addition, since the consumption power was reduced, a luminance life of the EL device was prolonged to be 10 times or more that of the conventional device.

In the above embodiment and example, the interlayer 6 is inserted between the luminance layer 3 and the current-limiting layer 4. However, the luminous efficiency is effectively increased by inserting the interlayer 6 between the luminescent layer 3 and the transparent electrode 2, between the divided luminescent layers, or between all these portions.

In the above example, zinc sulfide containing Mn is used in the luminescent layer. In addition to Mn, however, rare-earth metals such as Tb, Sm and Tm or their fluorides or chlorides can be used in the luminescent layer to achieve the same effect.

Figure 3:
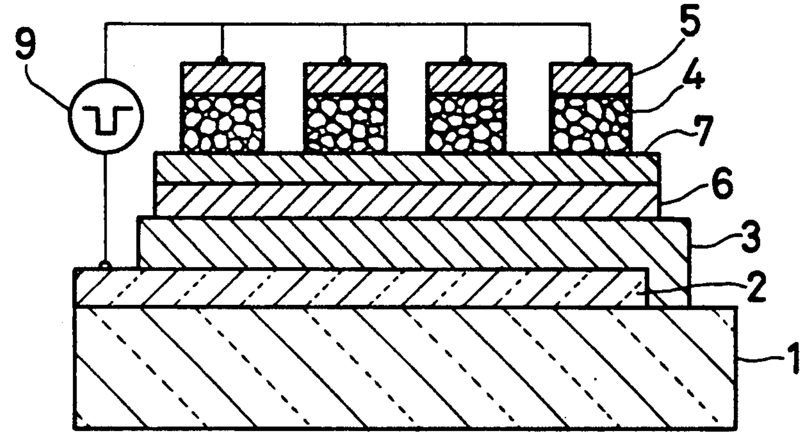
FIG. 3 is a sectional view showing an electroluminescence device of the second embodiment of the present invention.

As shown in FIG. 3, the second embodiment of the present invention is constituted by sequentially stacking a transparent electrode 2, a luminescent layer 3, a first interlayer 6, a second interlayer 7, a current-limiting layer 4 and a backplate 5 on a transparent glass substrate 1.

As in the first embodiment, the first interlayer 6 contains a semiconductor having a band gap of 2.4 eV or more, and preferably, CaS, SrS or BaS. The second interlayer 7 prevents oxidation of the first interlayer 6.

The following example, which has the same structure as described in said second embodiment, is given.

EXAMPLE 2

An electroluminescence device having the structure shown in FIG. 3 was manufactured as follows.

An ITO film having a thickness of about 400 nm was formed as a transparent electrode 2 on a glass substrate 1 by a reactive sputtering method, and this transparent electrode 2 was patterned into stripes at a pitch of three stripes per 1 mm in the X direction on an X-Y plane by photolithography. Subsequently, ZnS containing 0.6 wt % of Mn was used to form a film having a thickness of about 0.8 μm as a luminescent layer 3 at a substrate temperature of 200° C. by a resistance heating vapor deposition method.

A 50-nm thick CaS film (band gap=5.4 eV) was formed as a first interlayer 6 by an electron beam vapor deposition method, and a 100-nm thick ZnS film was formed as a second interlayer 7 by a resistance heating vapor deposition method. The substrate temperature during film formation was 200° C. for both the films. Subsequently, the resultant structure was annealed in vacuum at 550° C. for two hours.

A paint prepared by dispersing a powder mixture of carbon and barium titanate in a solution mixture of a resin and thinner was coated by a spraying method and dried, thereby forming a current-limiting layer 4 having a resistivity of $8\times10^4$ Ω·cm and a film thickness of 15 μm.

An Al film having a thickness of about 1 μm was formed as a backplate 5 by a vacuum vapor deposition method. Lastly, the current-limiting layer 4 and the backplate 5 were patterned into stripes in the Y direction by using a diamond needle.

In the dot-matrix EL device manufactured as described above, a luminous efficiency was increased as in the first embodiment. For this reason, as compared with conventional devices, a luminance was largely increased, consumption power was reduced, and a life of the device was prolonged.

In addition, the luminance of this device having a plurality of interlayers was more stable over time than that of a device having a single CaS interlayer. That is, the life of this device was longer than that of the conventional device. The reason for this result is assumed to be as follows.

That is, although CaS is a substance having excellent electrical characteristics because it increases a luminous efficiency, it is very easily oxidized. Therefore, if the first interlayer 6 containing CaS is in contact with the upper current-limiting layer 4 consisting of an oxide, the interlayer 6 is gradually oxidized during light emission over a long time period, and the electrical characteristics required for CaS are lost. ZnS is a stable substance since it is not easily oxidized as compared with CaS. Therefore, when a multilayered structure of the interlayer 6 containing CaS and the interlayer 7 containing ZnS was formed such that the interlayer layer 6 was arranged at the luminescent layer 3 side and the interlayer 7 containing ZnS was arranged at the current-limiting layer 4 side, the interlayer 6 containing CaS increased the luminous efficiency of the device, and the interlayer 7 containing ZnS prevented oxidation of CaS. As a result, a high luminous efficiency and a long life for EL device were obtained.

Such a multilayered structure is effective when a substance which is easily oxidized such as SrS or BaS is used in place of CaS. Any substance can be used in the second interlayer 7 for preventing oxidation as long as the substance essentially does not contain oxygen or contains only a little amount of oxygen and has a resistivity of $10^3$ Ω·cm or less at a threshold voltage of the luminescent layer. Examples of the substance are, in addition to ZnS, Group II-VI substances such as ZnSe and CdS, silicon nitrides not containing oxygen, nitrides such as aluminum nitride, and oxynitrides thereof containing only a small amount of oxygen. These substances have a good function. In addition, silicides, carbides and borides of transition metals can be used.

For the same reason as in the first embodiment, the film thickness is preferably 10 nm to 300 nm.

According to the EL devices of the above first and second embodiments, the following advantages are obtained. That is, a luminous efficiency is increased to be much higher than those of conventional devices. Therefore, as compared with the conventional devices, a luminance can be increased, consumption power can be reduced, and a life of the device can be prolonged. In addition, a display using the EL devices of the present invention is significantly improved, and a range of applications of the display can be widened.

The third embodiment of the present invention has a stacking structure similar to that of the device shown in FIG. 4 and is constituted by sequentially stacking a transparent electrode 2, a luminescent layer 3, a current-limiting layer 4 obtained by fixing a conductive powder by a binder resin, and a backplate 5 on a transparent insulating substrate 1. A conductive powder mainly consisting of carbon black was used as the conductive powder of the current-limiting layer 4.

The carbon black includes various substances such as channel black, furnace black and acetylene black named in accordance with manufacturing methods and having different physical properties. Any of these substances can be used as long as a particle diameter is preferably 3 μm or less.

Examples of the conductive fine powder mainly consisting of the carbon black are a conductive fine powder consisting of only the carbon black and a powder prepared by mixing a conductive fine powder except for the carbon black in the carbon black. In particular, a mixture of the carbon black and a barium titanate-based semiconductor is preferable since a temperature coefficient of an electric resistance of the mixture easily becomes zero or more.

This barium titanate-based semiconductor is formed by adding a small amount of yttrium or cerium in a ferroelectric such as barium titanate, strontium titanate, or lead titanate to obtain conductivity. The particle diameter of this semiconductor is also preferably 3 μm or less.

When the two type of substances are sandwiched between brass electrodes and a load of 6 kg is applied, resistivities of the substances in the form of a fine powder are $10^{-2}$ to $10^{1}$ Ω·cm and $10^{6}$ to $10^{8}$ Ω·cm for the carbon black and the barium titanate-based semiconductor, respectively. Since a preferably resistivity of the conductive fine powder of the current-limiting layer 4 to $10^{4}$ to $10^{6}$ Ω·cm, a resistivity falling within this range can be obtained by mixing the two substances.

A mixture of these powers is used in the form of a powder or solvent-dispersible sol and fixed by using a binder resin. Before the powder mixture is dispersed in a binder resin solution, a coupling agent may be used to improve dispersion properties of the mixture. In this case, an aluminum-based coupling agent can provide a most preferable effect.

Examples of the binder resin are a vinyl-based resin, a polyester-based resin, a polyamide-based resin, a cellulose-based resin, a polyurethane-based resin, a urea-based resin, an epoxy-based resin, a melamine-based resin and a silicone-based resin. In particular, a polymer material having a polar group such as a hydroxy group, a carboxyl group, a sulfonyl group or a nitro group or a reactive group such as an epoxy group, an isocyanuric group or a silanol group can be preferably used.

A volume mixing ratio of the binder resin, the carbon black fine powder and the barium titanate-based semiconductor fine powder preferably satisfies all of the following relations (1) to (3):

$$C/A \geqq 1.5 \quad (1)$$

$$B \geqq 50\% \quad (2)$$

$$C \geqq 5\% \quad (3)$$

(where A is the ratio of the solid volume of the barium titanate to the volume of the current-limiting layer, B is the ratio of the solid volume of the binder resin to the volume of the current-limiting layer, and C is the ratio of the solid volume of the carbon black to the volume of the current-limiting layer).

The "solid volume" means not an apparent volume but a true volume in the case of a powder material and means a volume of a solidified material not containing a solvent or the like in the case of a resin material.

If the relations (1) and (2) are not satisfied, the resistance of the current-limiting layer 4 tends to be increased. If the relation (2) is not satisfied, film formation properties are easily degraded, e.g., the current-limiting layer 4 cracks.

In the internal structure of the current-limiting layer 4, local uniformity of an electrical resistance is most important. In the present invention, clusters of the carbon black are easily produced. Therefore, it is preferred to use a dispersion method not producing clusters or to remove clusters. After the carbon black is dispersed in the binder resin solution, large particles of the carbon black can be removed by filtering using a filter having a hole diameter of 5 μm or less.

The above third embodiment has been made in consideration of the fact that a luminance variation or a short life of the conventional hybrid type EL device is caused by a vicious cycle in which "the electric resistance of the current-limiting layer is reduced by a temperature rise caused by luminescence to flow a larger current, thereby further increasing the temperature". According to this embodiment, a mixture of the carbon black and the barium titanate-based semiconductor or the carbon black, in which a change in electrical resistance with respect to the temperature rise is positive or very small, is used as the current-limiting layer. Therefore, breakdown caused by heat generation in conventional devices using $MnO_2$ can be prevented.

The following examples, whose current-limiting layers contain carbon black as described in said third embodiment, are given.

Electroluminescence devices having the structure shown in FIG. 4 were manufactured as follows.

EXAMPLE 3

An ITO film having a thickness of about 500 nm was formed as a transparent electrode 2 on a glass substrate 1 by a reactive sputtering method, and this transparent electrode 2 was patterned into a predetermined shape by photolithography. Subsequently, a ZnS film doped with 0.3 wt % of Mn was formed as a luminescent layer 3 to have a thickness of about 1 μm by an electron beam vapor deposition method.

Carbon black (SEAST 9H (tradename): TOKAI CARBON CO., LTD.) was dispersed in a solvent mixture solution of an aluminum-based coupling agent (AL-M (tradename): Ajinomoto Co., Inc.), and a solution mixture of a binder resin (MR-110 (tradename): Japan Zeon Co., Ltd.) and a thinner was added to the resultant mixture so that a volume ratio of the carbon black to the binder resin after solidification was 2:8. The resultant solution mixture was filtered by a 10-μm thick teflon membrane filter and then by a 5-μm thick Teflon membrane filter. A paint prepared as described above was coated by a spraying method and dried to form a current-limiting layer 4 having a resistivity of $4\times10^4$ Ω·cm and a film thickness of 15 μm. The formed current-limiting layer 4 was a black layer with no void, solidified by the resin and having a substantially uniform thickness.

An Al film having a thickness of about 1 μm was formed as a backplate 5 by a vacuum vapor deposition method, and the current-limiting layer 4 and the Al film 5 were simultaneously scribed by using a diamond needle to form a predetermined backplate pattern.

When the EL devices manufactured as described above were connected to a driver to emit light, light was emitted uniformly from the entire surface, and no luminance variation was observed.

EXAMPLE 4

A mixture of 6:1 (volume ratio) of carbon black (SEAST 9H (tradename): TOKAI CARBON CO., LTD.) and a barium titanate-based semiconductor (PTC-SN (tradename): KYORITSU CERAMIC MATERIALS CO., LTD.) was dispersed in a solvent mixture solution of an aluminum-based coupling agent (AL-M (tradename): Ajinomoto Co., Inc.), and a solution mixture of a binder resin (MR-110 (tradename): Japan Zeon Co., Ltd.) and a thinner was added to the resultant mixture so that a volume ratio of the total volume of powders to the binder resin was 1.75:8.25. Following the same procedures as in Example 3, the prepared solution mixture was filtered by a 10-μm thick Teflon membrane filter and then by a 5-μm thick Teflon membrane filter, thereby preparing a paint.

The prepared paint was coated by a spraying method and dried on a glass substrate 1 (a luminescent layer 3) having the luminescent layer 3 and a transparent electrode 2 manufactured following the same procedures as in Example 3, thereby forming a current-limiting layer 4 having a resistivity of $1\times10^6$ Ω·cm and a film thickness of 15 μm.

A backplate 5 was formed following the same procedures as in Example 3 and scribed by using a diamond needle to form a predetermined backplate pattern.

When the EL devices manufactured as described above were connected to a driver to emit light, light was emitted uniformly from the entire surface, and no luminance variation was observed.

EXAMPLE 5

A mixture of 11:5 (volume ratio) of carbon black (SEAST 9H (tradename): TOKAI CARBON CO., LTD.) and a barium titanate-based semiconductor (PTC-SN (tradename): KYORITSU CERAMIC MATERIALS CO., LTD.) was dispersed in a solvent mixture solution of an aluminum-based coupling agent (AL-M (tradename): Ajinomoto Co., Ltd.), and a solution mixture of a binder resin (MR-110 (tradename): Japan Zeon Co., Ltd.) and a thinner was added to the resultant mixture so that a volume ratio of the total volume of powders and the binder resin was 4:6.

Following the same procedures as in Example 3, the solution mixture prepared as described above was filtered by a 10-μm thick Teflon membrane filter and then by a 5-μm thick Teflon membrane filter, thereby preparing a paint.

The prepared paint was coated by a spraying method and dried on a glass substrate 1 (a luminescent layer 3) having the luminescent layer 3 and a transparent electrode 2 manufactured following the same procedures as in Example 3, thereby forming a current-limiting layer 4 having a resistivity of $3\times10^5$ Ω·cm and a film thickness of 15 μm.

A backplate 5 was formed following the same procedures as in Example 3 and scribed by using a diamond needle to form a predetermined backplate pattern.

When the EL devices manufactured as described above were connected to a driver to emit light, light was emitted uniformly from the entire surface, and no luminance variation was observed.

Figure 5:
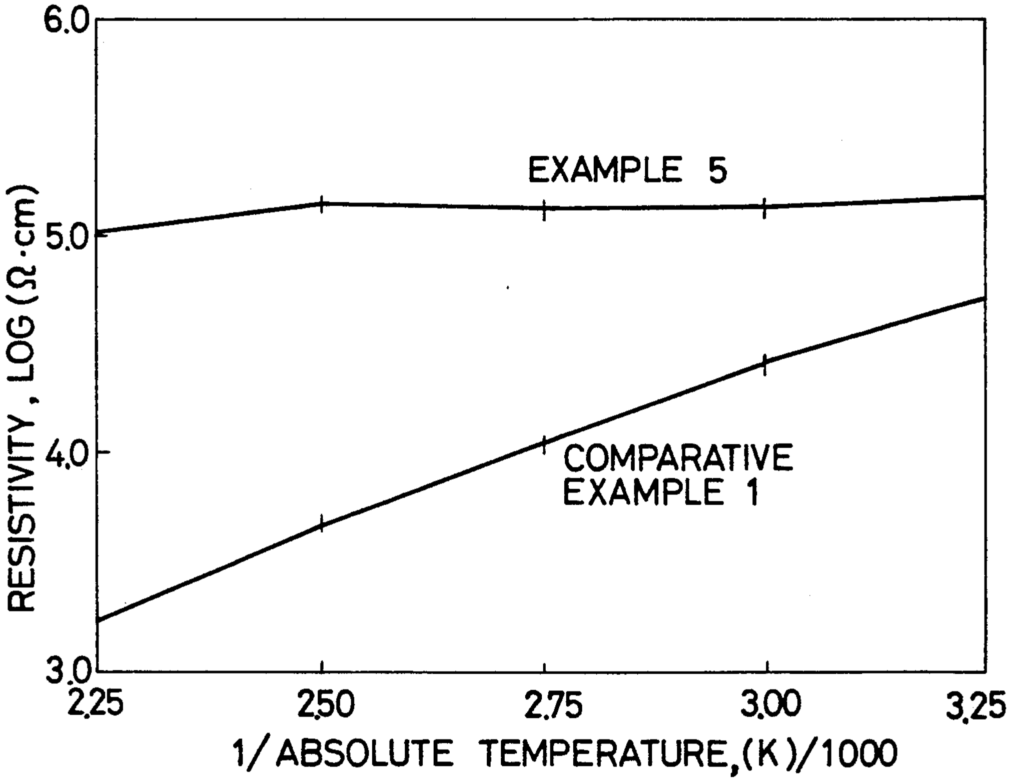
FIG. 5 is a graph showing a relationship between a resistivity of a current-limiting layer and a temperature obtained in each of electroluminescence devices of an example and a comparative example of the third embodiment.

A change in resistivity according to a temperature change of the current-limiting layer 4 manufactured in Example 5 was measured. The measurement result is shown in FIG. 5. As is apparent from FIG. 5, the resistivity of the current-limiting layer of Example 5 did not depend on a temperature by exhibited a substantially constant value.

COMPARATIVE EXAMPLE 1

An $MnO_2$ powder prepared by an electrolytic process was milled by a ball mill to obtain an average particle size of 0.3 μm, and a solution mixture of a binder resin (MR-110 (tradename): Japan Zeon Co., Ltd.) and a thinner was added to the resultant powder so that a volume ratio of the volume of the $MnO_2$ powder to the volume of the binder resin was 3:7. Following the same procedures as in Example 3, the solution mixture prepared as described above was filtered by a 10-μm thick Teflon membrane filter and then by a 5-82 m thick Teflon membrane filter, thereby preparing a paint.

The prepared paint was coated by a spraying method and dried on a glass substrate 1 (a luminescent layer 3) having the luminescent layer 3 and a transparent electrode 2 manufactured following the same procedures as in Example 3, thereby forming a current-limiting layer 4 having a resistivity of $5\times10^4$ Ω·cm and a film thickness of 20 μm.

A backplate 5 was formed following the same procedures as in Example 3 and scribed by using a diamond needle to form a predetermined backplate pattern.

When the EL devices manufactured as described above were connected to a driver to emit light, the temperature of a panel was increased as the luminance was increased, and breakdown was caused sequentially from devices at a brightest portion of the panel.

A change in resistivity according to a temperature change of the current-limiting layer of Comparative Example 1 was measured following the same procedures as in Example 5. The measurement result is shown in FIG. 5.

As is apparent from FIG. 5, as compared with the resistivity of the current-limiting layer of Comparative Example 1, the resistivity of the current-limiting layer of Example 5 was substantially constant regardless of the temperature.

According to the EL device of the above third embodiment, the following advantages are obtained. That is, a luminance variation in the EL device using the current-limiting layer can be improved and breakdown can be prevented, thereby improving the reliability of the EL device.

In addition, in the EL device of this embodiment, the resistivity of the current-limiting layer is constant regardless of the temperature. Therefore, time variations of both required power and a luminance are small.

The fourth embodiment has a stacking structure similar to that of the device shown in FIG. 4, in which a conductive powder contained in a current-limiting layer 4 is electrically in point contact with the surface of a luminescent layer 3.

In order to form the conductive powder to be electrically in point contact with the luminescent layer 3, the conductive powder preferably has a nib which can be in point contact with the luminescent layer 3.

For this purpose, the conductive powder desirably consists of particles having nibs or an aggregate of the particles. A practical shape of the particle having a nib is assumed to be a shape except for a sphere, a spheroid and a shape surrounded by another irregular continuous curved surface. Macroscopically, the shape of the particle includes a point which cannot be differentiable at least at one portion of the curved surface. Physically, the shape can be expressed as an object having a portion with a radius of curvature of 5 nm or less. A contact portion is assumed to be a point when the contact portion surface having a radius of curvature of 5 nm or less is brought into physical contact with a plane.

In order to set the minimum value of the radius of curvature of the contact portion of the conductive powder with respect to the luminescent layer 3 to be 5 nm or less, the particle size of the conductive powder is preferably 10 nm or less, or the conductive powder preferably has a corresponding portion at least in a part thereof.

Examples of the shape are a tetrahedron, a hexahedron, an octahedron, a dodecahedron, an icositetrahedron, a column, a spindle and a needle.

Examples of particles having the above shapes are as follows.

That is, examples of a hexahedral particle are a manganese(II) carbonate particle produced by a reaction between manganese sulfate and ammonium bicarbonate in an aqueous solution, a cubic hematite particle produced by hydrolysis of an iron(III) hydroxo complex in an alcohol solution, and an ITO (indium oxide: tin) ultrafine particle produced by a vapor phase method.

An example of a columnar particle is a carbon fiber.

An example of a spindle-like particle is a spindle-like hematite particle produced by a reaction between iron(III) chloride and sodium dihydrogen phosphate in an aqueous solution.

When one type of particles having the above shapes or aggregates thereof are to be dispersed in the current-limiting layer 4 so as to be in contact with the surface of the luminescent layer 3, a part of the contact portion may not be in point contact (e.g., a contact of a portion having a radius of curvature of 5 nm or less) with the surface. For example, a particle may be in contact by its flat surface if particles or aggregates thereof are hexahedral or by its cylindrical surface if particles or aggregates thereof are columnar. That is, the contact portion is not necessarily in point contact with the surface. However, since the particles having the above shapes or aggregates thereof are in contact by their corners or sides with a certain possibility, the particles having these shapes can be used.

An aggregate of needle-like crystals can be in point contact regardless of the direction of particles. In particular, the shape of a radial aggregate in which needle-like crystals radially extend from one point is most preferred. Even if crystals do not extend from one point, a similar shape can provide substantially the same effect. It is important that the nibs of needle-like crystals are directed in substantially all directions.

An aspect ratio (length of major axis:length of minor axis) of such a needle-like crystal is preferably 5:1, and more preferably, 10:1. If minor axes are perpendicular to major axes, a ratio of the lengths of two minor axes perpendicular to each other is not particularly limited, but the lengths are preferably substantially the same. Although the size of the needle-like crystal represented by the length of the minor axis preferably falls within the range of 1 nm to 10 nm, a smaller size is more preferable as long as the size falls within this range. If the size is larger than 10 nm, a contact density with respect to the luminescent layer is decreased to reduce a luminous efficiency. If the size is smaller than 1 nm, the crystal no longer exhibits its properties as a substance, and its specific characteristics cannot be obtained. The length of the major axis of this needle-like crystal preferably falls within the range of 50 nm to 200 nm.

The structure of the nib portion of the needle-like crystal in the major axis direction is preferably a peak-head structure, i.e., a peaked structure. A structure in which the size is gradually decreased from a central portion toward the nib portion in the major axis direction (i.e., the number of constitutive atoms is decreased) to finally peak the nib portion (e.g., a radius of curvature is 5 nm or less), i.e., a so-called elongated spindle is most preferred.

Although the needle-like crystals having the structure and size as described above can be singly used, the crystals are preferably radially aggregated in order to increase the probability of point contact. When the needle-like crystals are radially aggregated, point contact can be obtained regardless of the direction of contact.

Since it is very difficult to radially aggregate needle-like crystals after the crystals are produced, the needle-like crystals and radial aggregates are conveniently, simultaneously produced. In this case, radially extended needle-like crystals are chemically bonded to each other at contact points.

Examples of the radial aggregates of needle-like crystals are $\alpha$-$MnO_2$ and $\gamma$-$MnO_2$ produced by a reaction in an aqueous solution of potassium permanganate and manganese sulfate, $\delta$-$MnO_2$ produced by a reaction in an aqueous solution of potassium permanganate and hydrochloric acid, and tetrapod-like ZnO produced by a vapor phase reaction.

These needle-like crystal radial aggregates sometimes form secondary particles to grow into larger particles in accordance with the reaction conditions. In this case, a luminous efficiency is reduced to cause undesired results.

These conductive powders are used singly or in the form of mixtures and fixed by using a binder. Before the conductive powders are dispersed in a binder solution, they may be treated with a coupling agent to improve their dispersion properties. In this case, an aluminum-based coupling agent or a titanate-based coupling agent can provide a most preferable effect.

Examples of the binder are a vinyl-based resin, a polyester-based resin, a polyamide-based resin, a cellulose-based resin, a polyurethane-based resin, a urea-based resin, an epoxy-based resin, a melamine-based resin, and a silicone-based resin. In particular, a polymer material having a polar group such as a hydroxyl group, a carboxyl group or a nitro group or a reactive group such as an epoxy group, an isocyanuric group or a silanol group can be preferably used.

A volume mixing ratio of the conductive powder and a resin used as the binder preferably falls within the range of 2:3 to 6:4 (powder:binder).

In this case, the volume means not an apparent volume but a true volume in the case of a powder material and means a volume of a solidified material not containing a solvent or the like in the case of a resin material.

If an amount of the binder resin is larger than that of the above range, the resistance of the current-limiting layer 4 is easily increased. If an amount of the conductive powder is larger than that of the above range, the current-limiting layer 4 easily cracks to degrade film formation properties.

The above fourth embodiment has been made in consideration of the fact that a luminous efficiency of a conventional hybrid type EL device is low because a contact state of the conductive powder in the current-limiting layer with respect to the luminescent layer is close to a surface contact. According to this embodiment, the conductive powder in the current-limiting layer 4 is electrically in point contact with the surface of the thin film of the luminescent layer 3. Therefore, the electric field intensity is locally increased at the contact portion to accelerate electrons, thereby realizing a high luminous efficiency.

The following examples, whose conductive powders in current-limiting layers are electrically in point contact with the surfaces of luminescent layers as in said fourth embodiment, are given.

An electroluminescence device having the structure shown in FIG. 4 was manufactured as follows.

EXAMPLE 6

Manganese sulfate was added to an aqueous solution of potassium permanganate to cause a reaction, and the resultant precipitate was washed with water and dried to obtain $\gamma$-$MnO_2$ needle-like crystal aggregates. This $\gamma$-$MnO_2$ was a particle consisting of 5 nm$\times$5 nm$\times$150 nm needle like crystals and having an average particle size of about 500 nm. A radius of curvature of the nib of each needle-like crystal was about 4 nm.

An ITO film having a thickness of about 500 nm was formed as a transparent electrode 2 on a glass substrate 1 by a reactive sputtering method, and this transparent electrode 2 was patterned into a predetermined shape by lithography. Subsequently, a ZnS film containing 0.3 wt % of Mn and having a thickness of about 1 μm was formed by an electron beam vapor deposition method. In addition, a ZnSe thin film was formed to have a thickness of about 60 nm by an electron beam vapor deposition method.

A solution mixture of a binder resin (MR-110 (tradename): Japan Zeon Co., Ltd.) and a thinner was added to the $\gamma$-$MnO_2$ powder prepared as described above so that a volume ratio of the powder to the binder resin after the material was solidified was 3:7, and the resultant material was dispersed for an hour by using a sand mill.

A paint prepared as described above was coated by a spraying method and dried to form a current-limiting layer 4 having a resistivity of $8\times10^4$ Ω·cm and a film thickness of 15 μm. The formed current-limiting layer 4 was a black layer with no voids solidified by the binder resin and having a substantially uniform thickness.

An Al film having a thickness of about 1 μm was formed as a backplate 5 by a vacuum vapor deposition method, and the current-limiting layer 4 and the backplate 5 were simultaneously scribed by using a diamond needle, thereby forming a predetermined backplate pattern.

When the EL devices manufactured as described above were connected to a driver to emit light, light was uniformly emitted from the entire surface, no luminance variation was observed, and a luminous efficiency was 0.8 lm/W.

EXAMPLE 7

Hydrochloric acid was added to an aqueous solution of potassium permanganate heated up to 90° C. to cause a reaction, and the precipitate was washed with water and dried to obtain $\delta$-$MnO_2$ needle-like crystal radial aggregates. In this $\delta$-$MnO_2$, 5 nm$\times$5 nm$\times$150 nm needle-like crystals were radially grown, and an average particle size of the aggregate was 0.2 to 0.4 μm. A radius of curvature of the nib of each needle-like crystal was 3 nm.

An ITO film having a thickness of about 500 nm was formed as a transparent electrode 2 on a glass substrate 1 by a reactive sputtering method, and this transparent electrode 2 was patterned into a predetermined shape by photolithography. Subsequently, a ZnS film containing 0.3 wt % of Mn and having a thickness of about 1 μm was formed as a luminescent layer 3 by an electron beam vapor deposition method. In addition, a ZnSe thin film was formed to have a thickness of about 60 nm by an electron beam vapor deposition method.

A solution mixture of a binder resin (MR-110 (tradename): Japan Zeon Co., Ltd.) and a thinner was added to the $\delta$-$MnO_2$ powder prepared as described above so that a volume ratio of the powder and the binder resin after the material was solidified was 3:7, and the resultant material was dispersed for three hours by a sand mill.

The paint prepared as described above was coated by a spraying method and dried to form a current-limiting layer 4 having a resistivity of $2\times10^5$ Ω·cm and a film thickness of 10 μm. The formed current-limiting layer 4 was a black layer with no voids solidified by the binder resin and having a substantially uniform thickness.

An Al film having a thickness of 1 μm was formed as a backplate 5 by a vacuum vapor deposition method. Thereafter, the current-limiting layer 4 and the backplate 5 were simultaneously scribed by using a diamond needle, thereby forming a predetermined backplate pattern.

When the EL devices manufactured as described above were connected to a driver to emit light, light was uniformly emitted from the entire surface, no luminance variation was observed, and a luminous efficiency was 1.1 lm/W.

COMPARATIVE EXAMPLE 2

A $\gamma$-$MnO_2$ powder prepared by an electrolytic process was milled by using a ball mill into a substantially spherical powder having an average particle size of 0.3 μm, and a solution mixture of a binder resin (MR-110 (tradename): Japan Zeon Co., Ltd.) and a thinner was added to the $MnO_2$ powder so that a volume ratio of the powder and the binder resin was 3/7, thereby preparing a paint following the same procedures as in Example 6.

The prepared paint was coated by a spraying method and dried on a glass substrate (a luminescent layer 3)

having the luminescent layer 3 and a transparent electrode 2 manufactured following the same procedures as in Example 6, thereby forming a current-limiting layer 4 having a resistivity of $8 \times 10^4$ Ω·cm and a film thickness of 20 μm.

A backplate 5 was formed following the same procedures as in Example 6 and scribed by using a diamond needle, thereby forming a predetermined backplate pattern.

When the EL devices manufactured as described above were connected to a driver to emit light, light was uniformly emitted from the entire surface and no luminance variation was observed, but a luminous efficiency was 0.1 lm/W.

According to the EL device of the above fourth embodiment, the following advantages can be obtained. That is, a luminous efficiency of the hybride EL device can be increased to realize low-consumption power activation. In addition, since a necessary luminance can be obtained with low power, life characteristics of the EL device can be improved.

What is claimed is:

1. A highly luminous efficient electroluminescence device with a long device life having sequentially stacked elements on a transparent and electrically insulating substrate, comprising:

a) a first transparent electrode;

b) a luminescent layer;

c) a current-limiting layer comprising a binder and a conductive powder, said conductive powder essentially consisting of carbon black;

d) an interlayer containing a first semiconductor having a band gap of more than 2.4 eV, said interlayer being disposed between said current-limiting layer and said luminescent layer, said interlayer further comprising a first sub-interlayer and a second sub-interlayer which is placed below said first sub-interlayer, said first sub-interlayer essentially consisting of at least one element selected from the group consisting of CaS, SrS and BaS, said second sub-interlayer being essentially free of oxygen and having a resistivity of less than $10^3$Ω cm at more than a threshold voltage of said luminescence layer; and e) a second electrode placed above said current limiting layer.

2. An electroluminescence device according to claim 1, wherein said luminescent layer consists essentially of a second semiconductor and is doped with an element serving as a luminescent center.

3. An electroluminescence device according to claim 2, wherein said element serving as the luminescent center is doped in said first semiconductor.

4. An electroluminescence device according to claim 3, wherein said first and second semiconductors are of different types.

5. An electroluminescence device according to claim 3, wherein said first and second semiconductors are of the same type and have different band gaps.

6. An electroluminescence device according to claim 1, wherein said first semiconductor is at least one type of a semiconductor selected from the group consisting of ZnS, ZnSe, CaS, CaSe, SrS, SrSe and Cds.

7. An electroluminescence device according to claim 1, wherein an additional interlayer is formed between said first electrode and said luminescent layer.

8. An electroluminescence device according to claim 1, where said luminescent layer is divided into at least two sub-layers, an additional interlayer being formed between said divided sub-layers.

9. An electroluminescence device according to claim 1, wherein said interlayer has a film thickness of 10 nm to 300 nm.

10. An electroluminescence device according to claim 9, wherein said interlayer has a film thickness of 50 nm to 150 nm.

11. An electroluminescence device according to claim 1 wherein said second sub-interlayer essentially consists of a material selected from the group consisting of ZnS, ZnSe, CdS, silicon nitride, aluminum nitride, silicon oxynitride essentially free of oxygen and aluminum oxynitride essentially free of oxygen.

12. An electroluminescence device according to claim 1 where said second sub-interlayer essentially consists of a material selected from a group consisting of a silicide, a carbide and a boride of a transition metal.

13. An electroluminescence device comprising a first transparent electrode, a luminescent layer, a current-limiting layer comprising a conductive powder and a binder, wherein said conductive powder consists of particles each having at least one nib or aggregates thereof, said nib being electrically in point contact with a surface of said luminescent layer, and a second electrode, said first electrode, luminescent layers, current limiting layer and secured electrode being sequentially stacked on a transparent substrate which has electrical insulating properties.

14. An electroluminescence device according to claim 13, wherein a radius of curvature of said nib of said conductive powder to be electrically in point contact with the surface of said luminescent layer is not more than 5 nm.

15. An electroluminescence device according to claim 14, wherein a particle size of said conductive powder is not more than 10 nm.

16. An electroluminescence device according to claim 13, wherein a shape of said particles or aggregates is selected from the group consisting of a tetrahedron, a hexahedron an octahedron, an icositetrahedron, a column, a spindle or a needle.

17. An electroluminescence device according to claim 13, wherein said particles each having a nib or aggregates thereof are radial aggregates in which needle-like crystals are radially aggregated.

18. An electroluminescence device according to claim 17, wherein an aspect ratio of a major axis to a minor axis of said needle-like crystal is not less than 5:1.

19. An electroluminescence device according to claim 18, wherein said aspect ratio is not less than 10:1.

20. An electroluminescence device according to claim 18, wherein said needle-like crystal is an elongated spindle elongated in a major axis direction thereof.

21. An electroluminescence device according to claim 17, wherein a length of two minor axes perpendicular to each other of said needle-like crystal is 1 nm to 10 nm, and a length of a major axis thereof is 50 nm to 200 nm.

22. An electroluminescence device according to claim 17, wherein said radial aggregate of needle-like crystals consists of $\alpha$-$MnO_2$ or $\gamma$-$MnO_2$ produced by a reaction in an aqueous solution of potassium permanganate and manganese sulfate, $\delta$-$MnO_2$ produced by a reaction in an aqueous solution of potassium permanganate and hydrochloric acid, or tetra pod-like ZnO produced by a vapor phase reaction.

23. An electroluminescence device according to claim 13, wherein said binder comprises a polymeric organic resin selected from the group consisting of a polar group such as a hydroxyl group, a carboxyl group, a sulfonyl group or a nitro group, or a reactive group such as an epoxy group, an isocyanuric group and a silanol group.

24. An electroluminescence device according to claim 23, wherein a volume mixing ratio of said conductive powder to said binder resin falls within a range of 2:8 to 6:4.

25. An electroluminescence device according to any one of claim 1, 15 or 13, wherein said first electrode is divided into stripes in an X direction on an X-Y plane, and said current-limiting layer and said second electrode are divided into stripes in a Y direction.

26. An electroluminescence device according to any one of claim 1, 15, or 13, wherein at least said first electrode is divided into a predetermined pattern on a plan thereof.

27. An electroluminescence device having
a transparent first electrode,
a luminescent layer,
a current-limiting layer consisting of at least a binder resin consisting of a polymeric organic resin selected from the group consisting of a polar group such as a hydroxyl group, a carboxyl group, a sulfonyl group, a nitro group, and a reactive group including an epoxy group, an isocyanuric group and a silanol group and a conductive powder essentially consisting of carbon black which comprises a barium titanate powder, wherein said barium titanate powder and said binder resin satisfy the following relations (1) to (3):

$$C/A \geqq 1.5 \quad (1)$$

$$B \geqq 50\% \quad (2)$$

$$C \geqq 5\% \quad (3)$$

where A is the ratio of the solid volume of said barium titanate to the volume of said current-limiting layer, B is the ratio of the solid volume of said binder resin to the volume of said current-limiting layer, and C is the ratio of the solid volume of said carbon black to the volume of said current-limiting layer;
a second electrode; and
a transparent substrate having electrical insulating properties,
said first electrode, said luminescent layer, said current-limiting layer and said second electrode being sequentially stacked on said transparent substrate.

* * * * *